United States Patent
Wiesinger et al.

(10) Patent No.: US 10,088,539 B2
(45) Date of Patent: Oct. 2, 2018

(54) SILENT MULTI-GRADIENT ECHO MAGNETIC RESONANCE IMAGING

(71) Applicant: General Electric Company, Schenectady, NY (US)

(72) Inventors: Florian Wiesinger, Freising (DE); Anne Menini, Munich (DE); Ana Beatriz Solana Sanchez, Munich (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 341 days.

(21) Appl. No.: 15/142,957

(22) Filed: Apr. 29, 2016

(65) Prior Publication Data
US 2017/0307703 A1    Oct. 26, 2017

Related U.S. Application Data

(60) Provisional application No. 62/326,589, filed on Apr. 22, 2016.

(51) Int. Cl.
*G01R 33/385*    (2006.01)
*G01R 33/48*    (2006.01)
*G01R 33/561*    (2006.01)

(52) U.S. Cl.
CPC ..... *G01R 33/3854* (2013.01); *G01R 33/4816* (2013.01); *G01R 33/5616* (2013.01)

(58) Field of Classification Search
CPC ........ G01R 33/48; G01R 33/50; G01R 33/54; G01R 33/543; G01R 33/561; G01R 33/5602; G01R 33/5612; G01R 33/5613; G01R 33/5616; G01R 33/5614; G01R 33/5617; G01R 33/482; G01R 33/4824;
(Continued)

(56) References Cited

U.S. PATENT DOCUMENTS

| 6,445,184 B1 | 9/2002 | Tanttu |
| 2004/0160221 A1* | 8/2004 | Kiefer ................ G01R 33/482 324/307 |
| 2009/0238430 A1* | 9/2009 | Haider ................ G01R 33/482 382/131 |
| 2015/0115956 A1 | 4/2015 | Ackerman et al. |

(Continued)

FOREIGN PATENT DOCUMENTS

| WO | 2015082128 A1 | 6/2015 |
| WO | 2015086476 A1 | 6/2015 |
| WO | 2015113870 A1 | 8/2015 |

OTHER PUBLICATIONS

Wild, Jim W., et al.; "Multiple gradient echo sequence optimized for rapid, single-scan mapping of Rmath image at high B0", Magnetic Resonance in Medicine, vol. 48, Issue 5, Nov. 2002.

(Continued)

*Primary Examiner* — Son Le
(74) *Attorney, Agent, or Firm* — GE Global Patent Operation; Pabitra Chakrabarti

(57) ABSTRACT

Methods and systems for production of silent, multi-gradient-echo, magnetic resonance images are provided. The methods employ iterative application of small updates to the magnetic field gradient followed by a short, non-selective radiofrequency pulse excitation and for free induction decay data acquisition. The magnetic field gradient updates allow for silent, self-refocusing pulse sequence. Subsequent applications of the magnetic field gradients allow for multiple echo data acquisitions, which may allow fast, silent production of T2*-weighted images.

21 Claims, 8 Drawing Sheets

(58) Field of Classification Search
CPC .......... G01R 33/4826; G01R 33/4828; G01R 33/483; G01R 33/4835
See application file for complete search history.

(56) References Cited

U.S. PATENT DOCUMENTS

2015/0276906 A1 10/2015 Wiesinger et al.
2017/0356973 A1* 12/2017 Wheaton ............ G01R 33/3854

OTHER PUBLICATIONS

Reeder, Scott B., et al.; "Iterative Decomposition of Water and Fat with Echo Asymmetry and Least-Squares Estimation (IDEAL): Application with Fast Spin-Echo Imaging", Magnetic Resonance in Medicine 54:636-644 (2005).

Vautier, Julien, et al.; "2D and 3D radial multi-gradient-echo DCE MRI in murine tumor models with dynamic R*2-corrected R1 mapping", Magnetic Resonance in Medicine, vol. 64, Issues 1, pp. 313-318, Jul. 2010.

Luo, Jie, et al.; "Gradient Echo Plural Contrast Imaging—signal model and derived contrasts: T2*, T1, Phase, SWI, T1f, FST2* and T2*-SWI", Neuroimage, vol. 60, Issue 2, pp. 1073-1082, Apr. 2012.

Posse, Stefan, Ph.D., et al.; "MR Spectroscopic Imaging: Principles and Recent Advances", Journal of Magnetic Resonance Imaging 37:1301-1325 (2013).

Vautier, Julien, et al.; "Radial multigradient-echo DCE-MRI for 3D K(trans) mapping with individual arterial input function measurement in mouse tumor models", Magnetic Resonance in Medicine, vol. 70, Issue 3, pp. 823-828, Sep. 2013.

* cited by examiner

SILENT MULTI-GRADIENT ECHO MAGNETIC RESONANCE IMAGING

CROSS-REFERENCE TO RELATED APPLICATIONS

This application claims the benefit of U.S. Provisional Application No. 62/326,589 entitled "Silent Multi-Gradient Echo Magnetic Resonance Imaging" filed on Apr. 22, 2016, which is incorporated by reference herein in its entirety for all purposes.

BACKGROUND

The subject matter disclosed herein relates to magnetic resonance imaging (MRI), and more specifically, to systems and methods for producing MRI data with free induction decay (FID) and gradient echo data.

Generally, MRI images are produced from data that assess the interactions between magnetic fields and the nuclear spins of certain gyromagnetic materials, such as hydrogen nuclei, of the object being imaged. The imaged object may be immersed in a strong primary magnetic field, and subject to magnetic field gradients. In some applications, a radiofrequency (RF) magnetic field pulse may excite the gyromagnetic nuclei and move it from a basal state to an excited state. With the removal of the RF magnetic field pulse, the gyromagnetic nuclei may return to the basal state in a relaxation trajectory. During the relaxation, the gyromagnetic nuclei may emit RF signals that can be measured by an acquisition coil.

Magnetic field gradients may be applied to the object during the imaging process. Due to a relationship between the angular speed of the precession of a gyromagnetic material and the strength of the magnetic field, a magnetic field gradient may generate a spatial distribution of precession speeds. This effect leads to a spatial encoding of the RF signals emitted by the gyromagnetic nuclei. The spatial location of a given component of the acquired data may be determined based on the emission frequency of that component. Each spatial encoding may correspond to a region of a frequency space diagram, also known as a k-space diagram. Multiple gradients may be employed to cover more regions of the k-space diagram.

The data measured may be used to generate an image of the object. In some applications, the image is a map of the distribution density of the gyromagnetic nuclei. In other applications, the image may be a map of the distribution of the time constants related to the relaxation of the component of the nuclear magnetization parallel to the primary magnetic field, known as a T1-weighted image. In other applications, the image may be a map of the distribution of the time constants related to the relaxation of the components of the nuclear magnetization perpendicular to the primary magnetic field, known as T2-weighted image. In some applications, the image may be a map of the distribution of the effective time constants related to the relaxation of the components of the nuclear magnetization perpendicular to the primary magnetic field, known as T2*-weighted image.

To quantify T1, T2, or T2*, data is generally collected at least at two different time points of the relaxation process. Quantification of T1, T2 and T2* relaxation time may be used to produce T1, T2 and T2* maps of the object. In some situations, the time points may be determined based on a time interval called echo time (TE), which is the time between the RF magnetic field pulse and the time when the components of the nuclear magnetization perpendicular to the primary magnetic field align to produce an "echo" signal.

BRIEF DESCRIPTION

In an embodiment, a magnetic resonance imaging method includes acquiring a free induction decay (FID) dataset from a subject using a magnetic resonance imaging system. The FID dataset is obtained by performing a free induction decay (FID) acquisition process over iterations, each iteration corresponding to a k-space spoke of a sequence of k-space spokes. An iteration of the FID acquisition process includes updating a magnetic field gradient based on a k-space spoke of the sequence of k-space spokes corresponding to the iteration of the FID acquisition process; applying a radiofrequency excitation pulse while preserving the magnetic field gradient to encode the k-space spoke corresponding to the iteration of the FID acquisition process; and acquiring a first dataset corresponding to the k-space spoke corresponding to the iteration of the FID acquisition process, wherein the first dataset is at least a portion of the FID dataset. An interconnection of the k-space spokes of the sequence of k-space spokes forms a closed k-space trajectory that refocuses FID signals resulting from the application of the radiofrequency excitation pulse of an initial iteration of the FID acquisition process.

In another embodiment, a non-transitory computer-readable memory device that enables a magnetic resonance imaging system to produce silent, multi-gradient-echo, magnetic resonance images is described. The memory device may include instructions that control the radiofrequency excitation coils, the gradient coils and the acquisition coils of the system. As a result, the magnetic resonance imaging system may cause the gradient coils to produce a sequence of magnetic field gradients, each magnetic field gradient followed by a radiofrequency excitation pulse from the radiofrequency coils, and each excitation pulse followed by an acquisition of data using the acquisition coils. Each magnetic field gradient is based in part on a k-space spoke. The multiple spokes, when concatenated, produce a closed k-space trajectory, which results in a self-refocusing pulse sequence.

In another embodiment, a magnetic resonance imaging system is described. The system includes a scanner having gradient coils, radiofrequency coils and acquisition coils. The system also includes a control circuitry that may, iteratively, update the magnetic field produced by the gradient coils, apply non-selective radiofrequency excitation pulses using the radiofrequency coils and acquire data using acquisition coils. The radiofrequency pulse may be applied following the magnetic field gradient update, and the data acquisition may take place following the radiofrequency pulse. The updates to the magnetic field gradient may be based on the set of k-space spokes that will be employed. The multiple spokes, when concatenated, produce a closed k-space trajectory, which results in a self-refocusing pulse sequence.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
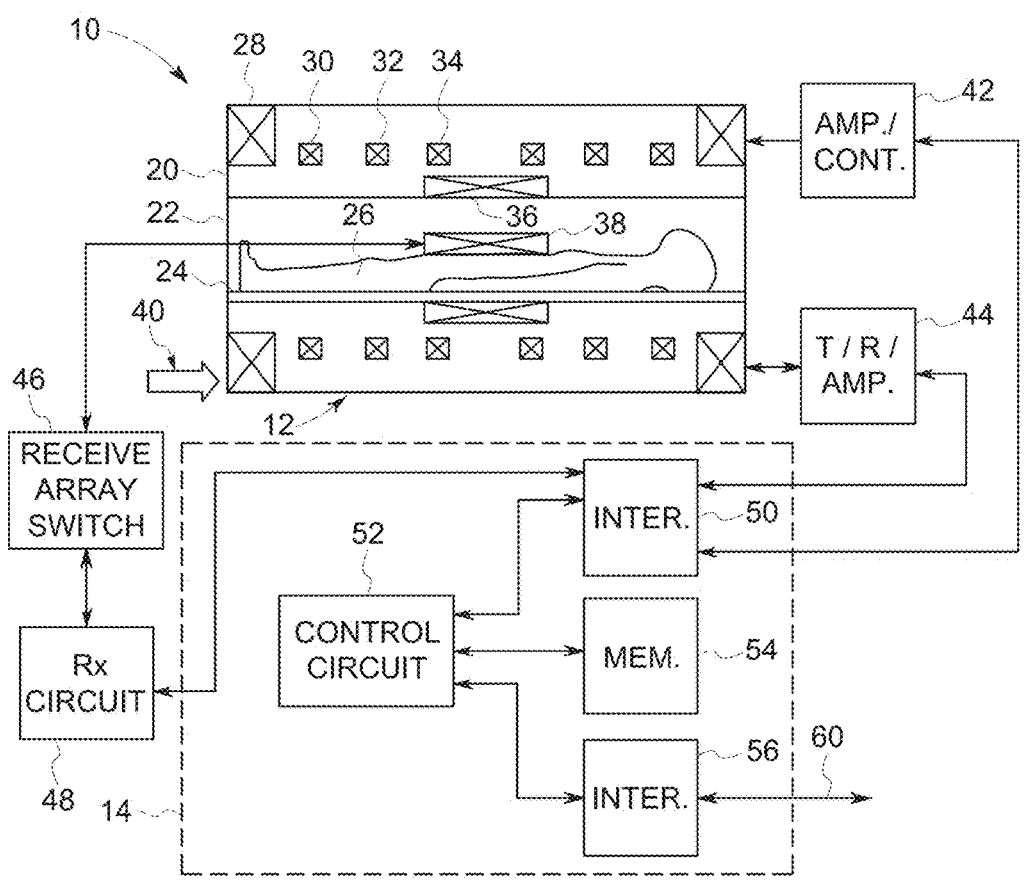
FIG. 1 illustrates a diagram of a magnetic resonance imaging system employed in a silent, multi-gradient-echo, MR imaging, in accordance with an embodiment.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with safety-related, system-related and business-related constraints, which may vary from one implementation to another. Moreover, it should be appreciated that such a development effort might be complex and time consuming, but would nevertheless be a routine undertaking of design, fabrication and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

In the descriptions below, it must be appreciated that the term "loop" may have two different meanings. In some situations, a "loop" may refer to a closed trajectory in a frequency space (or k-space). In other situations, "loop" refers to a part of a method that may be repeated. The meaning intended should be clear from the context.

Magnetic resonance imaging (MRI) uses systems capable of producing an image that maps specific properties of gyromagnetic materials of the object being imaged. More specifically, MRI systems measure the RF emission from gyromagnetic nuclei of the objects being imaged as a response to magnetic field perturbations created by coils of the MRI system. Usually, the object is immersed in a strong constant magnetic field and is subject to variable magnetic field gradients and RF excitation pulses. The RF emission may be sensed at pre-defined acquisition times.

From the data obtained from an MRI system, multiple types of images may be obtained. Examples of types of images include intensity images, complex (magnitude and phase) images, T1, T2 or T2*-weighted images, T1, T2 or T2* maps, and R1, R2 or R2* maps, with R1 representing the inverse of T1, R2 the inverse of T2 and R2* the inverse of T2*. Based on the type of image being created, a custom pulse sequence that enables acquisition of appropriate data with the MRI system may be applied.

The present disclosure is related to methods that allow an MRI system to produce 3D images using a silent, multi-gradient echo pulse sequence. The sequence may use a collection of datasets corresponding to a segment of the frequency space or k-space. Each segment of k-space may include multiple center-out spokes. The set of spokes of one segment may be produced using an acquisition trajectory resembling a looping geometry, which allows self-refocusing of the signals, as detailed below. For each segment, a dataset corresponding to FID and gradient echoes may be collected. The dataset related to the volume of the entire k-space of interest may be obtained by sampling multiple segments.

For each segment (a collection of k-space spokes), a segment pulse sequence may be applied. The segment pulse sequence may use a spatial encoding technique in which an RF excitation pulse may occur while a magnetic field gradient corresponding to a spoke of the segment is being applied. The technique may initially generate a certain number of free induction decay (FID) datasets resulting from the RF excitation pulses. Each FID dataset may be obtained through acquisition that starts immediately following the RF excitation pulse (TE=0). The application of all magnetic field gradients during the FID dataset acquisition may allow refocusing of the initial RF excitation pulse. Thus, a repeated application of the same magnetic fields in the same order as the one during the FID dataset acquisition, but without RF pulses, may allow acquisition of a gradient echo dataset with echo time TE=TE1. Subsequent gradient echo datasets may be obtained similarly, with echo times TE=2*TE, 3*TE, and so on.

The small magnetic field gradient updates that may be used in accordance with present embodiments may reduce the large change in the strong currents applied to the coils of the MRI system. As a result, the use of the techniques presented herein may lead to significantly reduced acoustic noise of the MRI system during operation. Acoustic noise due to changes in the coil currents and associated switching within the circuitry may disturb a patient going through a medical imaging process. In medical diagnostic techniques, such as during a functional magnetic resonance imaging (fMRI), this disturbance to the patient may interfere with the results of the diagnostic procedure. For example, when an association between brain activity and a cognitive function is being evaluated during an fMRI acquisition, the acoustic noise level may impact the cognitive function of the patient. As detailed below, the acoustic noise during operation within the bore, where the patient is situated, may be similar to the background noise before imaging is performed.

While the techniques described herein may be performed using a variety of types of MRI systems, an example of an MRI system 10 is shown schematically in FIG. 1. The MRI system 10 includes a scanner 12 and a scanner control system 14. The scanner 12 may have a housing 20 through which a bore 22 is formed. A movable table 24 may be used to allow a patient 26 to be positioned within the bore 22. The housing 20 of the scanner 12 may also include a primary magnet 28, which may establish a primary magnetic field for data acquisition. Magnetic gradient coils 30, 32 and 34 positioned in the scanner 12 may provide a magnetic field gradient that provides positional encoding of some of the gyromagnetic nuclei of the patient 26 during the imaging process. An RF excitation coil 36 of the system 10 may generate radiofrequency (RF) pulses for excitation of part of the gyromagnetic nuclei of the patient 26 during the imaging process. The MRI system 10 may also be provided with acquisition coils 38, which may read out RF signals produced by gyromagnetic nuclei within the patient 26 as the nuclei go from an excited state to a relaxed state. In some embodiments, the RF excitation coil 36 and the acquisition coil 38 may be substantially the same. The various coils and magnets of the scanner 12 may be powered by a main power supply 40.

The magnetic gradient coils 30, 32, 34 may be controlled by a driver circuit 42, which adjust the currents flowing through the magnetic gradient coils 30, 32, 34 and control their magnetic field. The RF excitation coil 36 may be controlled by a driver circuit 44 that may control an intensity, frequency and duration and time of the excitation pulse. Receive circuit 48 may acquire the weak RF signals detected by the acquisition coil 38. The driver circuits 42 and 44, and the acquisition coil 38 may be coupled, through an interface 50, to a control circuit 52. The control circuit 52 may include a general purpose processor, an application-specific integrated circuit (ASIC) and/or a programmable logic device (PLD). The control circuit 52 may communicate with a memory circuitry 54, which may store data acquired through the receive circuit 48. The memory circuitry 54 may also store instructions for the control circuit 52 and for the driver circuits 42 and 44 to control the gradient coils 30, 32, 34 and the RF excitation coil 36, respectively, in a particular manner.

The memory circuitry 54 may also store instructions to control the receive circuit 48. In some embodiments, the memory circuitry 54 may include instructions for multiple segment pulse sequences that allow the silent, multi-gradient echo pulse sequences that sample self-refocusing k-space segments, as detailed below. The memory circuitry 54 may also store instructions for the scanner 12 to perform preparatory pulse sequences, excitation pulse sequences, read-out pulse sequences and/or a gradient encoding sequence that may be used in accordance with the embodiments described herein. Memory circuitry 54 may also contain instructions to produce an image from the data stored. The instructions may enable production of a proton-density, a T1, a T2, or a T2*-weighted image. Moreover, scanner control interface 14 may have an interface 56 that allows a connection 60 between the MRI system 10 and other external equipment such as a computer cluster for image reconstruction or registration, a medical database, a diagnostic system, a PACS system, a display, a printer, a 3-D visualization interface or any other device that may use MRI images or data.

Figure 2:
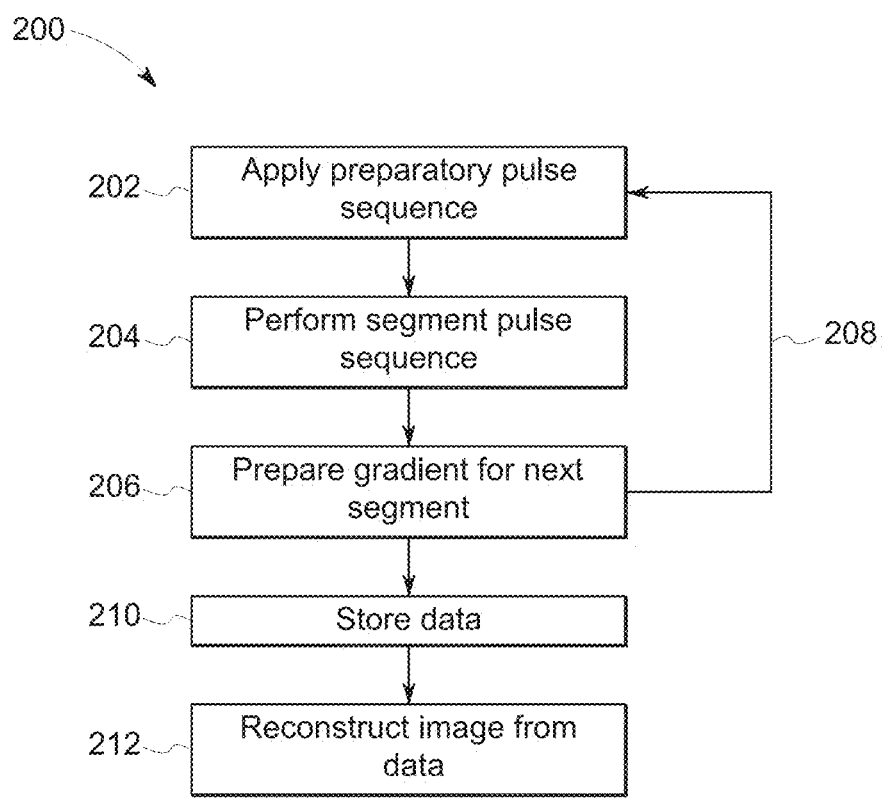
FIG. 2 illustrates a flow chart of a multi-gradient echo MRI technique, in accordance with an embodiment.

FIG. 2 depicts an embodiment of a method 200 to obtain an image from an MRI system using a multi-gradient-echo technique. The method 200 may generally be performed by the MRI system 10 by executing instructions stored on the memory circuitry 54. In this way, the scanner control 14 may be a specially-configured article of manufacture having instructions enabling the methods described herein to be performed by the scanner 12.

With an object inside the MRI system, a preparatory pulse sequence (block 202) may be applied. The preparatory pulse sequence (block 202) may include a sequence of RF excitation pulses that may prepare the magnetization of the gyromagnetic nuclei of the imaged object for improved data acquisition. The preparatory pulse sequence (block 202) may include a pulse sequence for selection of a spatial volume of the object to be imaged. In certain embodiments, the preparatory pulse sequence (block 202) may also prepare the sample to optimize the production of data suitable for the production of T1, T2 or T2*-weighted images. The preparatory pulse sequence (block 202) may be used prior to the collection of data associated with each self-refocusing segment.

A self-refocusing segment pulse sequence (block 204) may then be performed. As detailed below, the segment pulse sequence (block 204) may include a sequential application of gradient updates, multiple RF excitation pulses, and data acquisition cycles. The segment pulse sequence (block 204) may sample data through multiple k-space spokes via an acquisition trajectory having a closed geometry (e.g., a looping acquisition trajectory). The segment pulse sequence (block 204) may be used to obtain FID and gradient echo data related to the k-space region associated with the segment pulse sequence (block 204).

In order to cover a desired k-space volume, data corresponding to multiple k-space segments may be acquired through an iterative process. To that end, a magnetic field gradient that prepares the object for the acquisition of a next k-space segment may be applied (block 206), followed by an iteration (block 208). Each iteration may include an application of a preparatory pulse sequence (block 202), the segment pulse sequence (block 204) corresponding to a k-space segment, and an application of a magnetic field gradient for the next segment (block 206). In some embodiments, the preparatory pulse sequence (block 202) may be skipped for time reduction, for example if the type of image being generated does not necessarily require preparatory pulses. In embodiments where a repetition or a re-sampling of the data corresponding to a previously acquired segment is desired, the gradient preparation (block 206) may preserve the initial magnetic field gradient employed. The data acquired during the multiple segment pulse sequences (block 204) may be stored in a memory (block 210) (e.g., in memory circuitry 54). In some implementations, the data may be stored during or following each completion of an iteration 208. The stored data may be saved in a memory for posterior usage, such as to perform image reconstruction (block 212).

Figure 3:
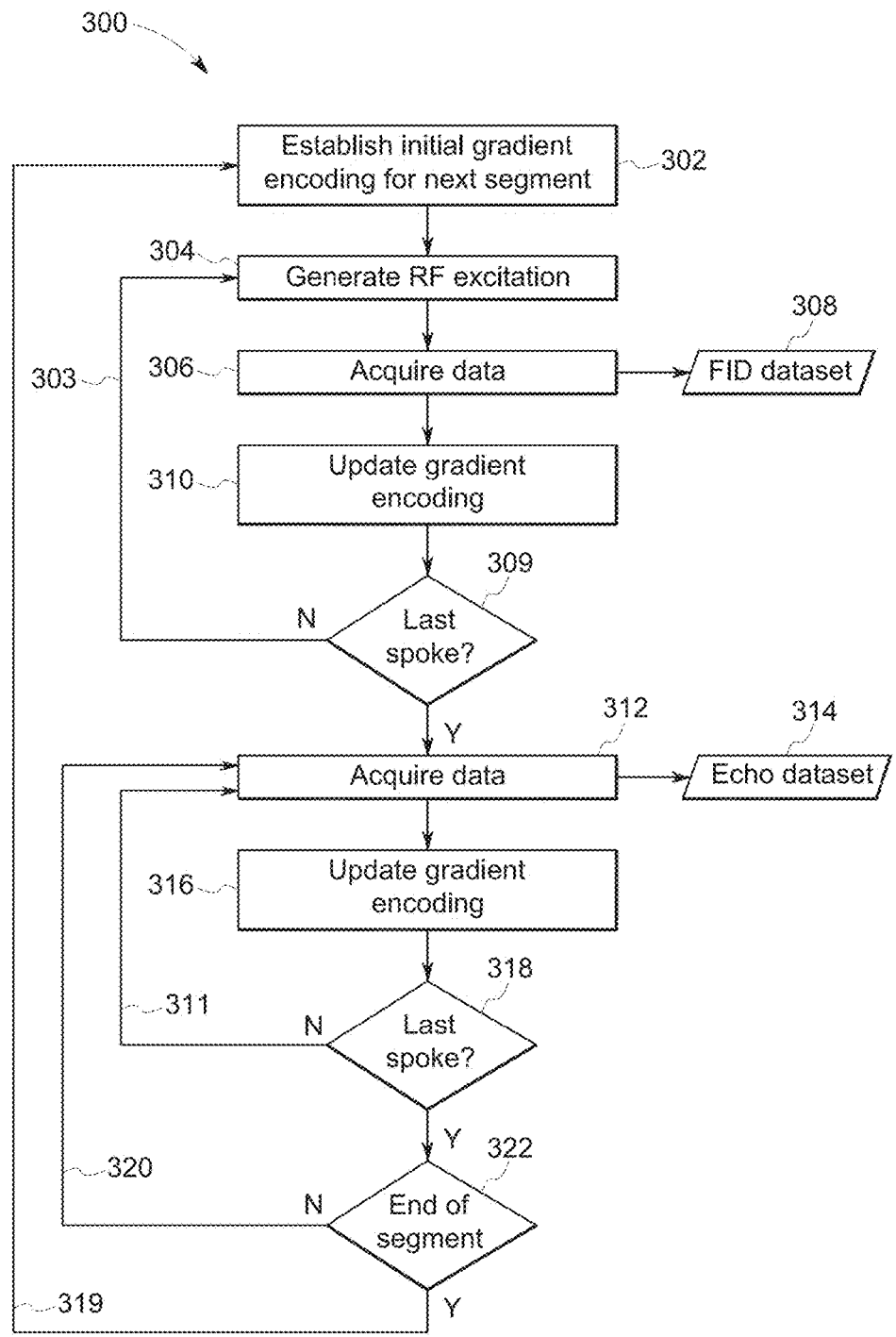
FIG. 3 illustrates a flow chart of a technique to produce self-refocusing multi-gradient encoding sequence that may be used in the technique of FIG. 2, in accordance with an embodiment.

As discussed above, the method 200 may be used to acquire data associated with regions of k-space through multiple segment pulse sequences. The acts performed in accordance with each segment pulse sequence (block 204) may be further appreciated with respect to FIG. 3, which illustrates a method 300 of performing a self-refocusing segment pulse sequence to acquire data associated with a segment of k-space. In the description of FIG. 3 herein, the term "loop" should be understood as a repeated portion of a method. An initial setup stage includes the initialization of the loop counter which tracks the iterations within a segment (block 301), and gradient encoding and initialization of a spoke counter which tracks the k-space spokes being sampled (block 302). The gradient encoding may be established through the gradient coils of the MRI system 10 of FIG. 1. The amplitude of the gradient encoding established in accordance with block 302 may remain essentially the same through the pulse sequence for each segment of k-space being sampled (e.g., including a plurality of spokes).

As described above, a segment pulse sequence may be used to obtain FID and gradient echo datasets corresponding to a segment of k-space formed by multiple spokes. The method 300 may include an FID acquisition process in the first acquisition process of the segment, i.e. when the loop counter is 1 (connector 303). In this FID acquisition process, an application of an RF excitation (block 304), followed by acquisition of FID data (block 306) may take place. The process is repeated for each k-space spoke until all spokes are covered during the FID acquisition process, as represented by the YES connector from decision block 309. To obtain data related to the next k-space spoke of the sequence, the encoding gradient may be updated and the spoke counter may be incremented (block 310). This update of the gradient may be much smaller than traditional gradient coil adjustments performed during other types of MRI sequences. This is because only minor directional changes to the overall gradient are being made to produce the acquisition trajectories described herein. Moreover, in some applications, gradient encoding updates may also be performed continuously during data acquisition, which may generate a smooth trajectory. In these situations, the resulting k-space spoke may be substantially curved, and the multiple set of spokes may form a smooth trajectory, as detailed below.

During each FID acquisition process, the RF excitation 304 may be applied (e.g., using RF coil 36 of FIG. 1). The RF excitation 304 may be a short non-selective RF excitation. The RF excitation may lead to precession of the gyromagnetic nuclei around the local magnetic field. In some implementations, the RF excitation (block 304) may lead to an angle between the gyromagnetic spin axis and the local magnetic field that is substantially smaller than 90°.

Following the RF excitation (block 304), the acquisition coils (e.g., acquisition coil 38 of FIG. 1) may be set to acquire FID data (block 306) to obtain a portion of the FID dataset corresponding to the k-space spoke being sampled in the present iteration. The acquisition (block 306) may take place immediately after the application of the RF excitation (block 304), resulting in a FID dataset 308 with TE=0 or a TE that is substantially small (e.g., negligible).

A gradient encoding update (block 310) may be used to prepare the spoke corresponding to the next iteration of the FID acquisition process. The gradient encoding update (block 310) may be a small change to the magnetic field gradient. Thus, the gradient update causes only a slight change in the currents of the gradient coils, enabling quiet operation of the system 10. In some embodiments, the gradient encoding update performed in accordance with the acts represented by block 310 may also take place in smaller steps, for example concurrently with data acquisition (block 306). Such gradient encoding updates and concurrent data acquisition may create a curved spoke. In these situations, the gradient update process may be smoother, which further reduces the magnitude of changes in the currents of the gradient coils, enabling even quieter operation of the system 10.

The FID acquisition process ends once all k-space spokes have been sampled, as represented by connector NO from decision block 309. Completion of the k-space spokes corresponding to the segment being sampled in the FID acquisition process may form a loop geometry, as discussed above. This loop geometry, in certain implementations, may result in signal refocusing, which can be used to collect additional echo signals. More specifically and by way of example, the sequential spatial encoding from the series of RF excitation pulses (block 304) and gradient updates (block 310) performed during the FID acquisition process (i_loop=1 in the example) may result in the refocusing of the signal associated with the RF excitation pulse (block 304) from the first iteration (i_spoke=1) of the FID acquisition process after the last spoke (i_spoke=number of spokes per loop). Moreover, a subsequent application of gradient updates (block 310) corresponding to the sequence of k-space spokes used in the first iterative process (i_loop=1) may provide a sequence of refocused signals associated with the RF excitations (block 304) applied in the FID acquisition process.

As illustrated by the NO connector 311, a first gradient echo acquisition process may follow a gradient update (block 310). Refocusing from subsequent gradient updates corresponding to the RF excitation (block 304) sampled in the FID acquisition process (i_loop=1) may provide gradient echo data that may be acquired (block 312). The gradient updates (block 310) in a gradient echo acquisition process (i_loop>1) may substantially follow the sequence of gradient updates of the FID acquisition process (i_loop=1). As a result, the k-space trajectory during a gradient echo acquisition process may substantially retrace the k-space trajectory during the FID acquisition process.

As described above, each iteration of a gradient echo acquisition process has a corresponding iteration in the FID acquisition process. At the beginning of each iteration of the first gradient echo acquisition process, the signal from the RF excitation (block 304) of the corresponding iteration of the FID acquisition process may be refocused. Data acquisition at the beginning of each iteration (block 312) provides a portion of a first gradient echo dataset corresponding to the k-space spoke associated with the iteration. As an example, if a FID dataset of a first spoke is acquired in a first iteration of the FID acquisition process (i_loop=1 and i_spoke=1), the corresponding gradient echo dataset for that first spoke may be acquired in a first iteration of the first gradient echo acquisition process (i_loop=2 and i_spoke=1). The resulting echo time may be TE=TE1, wherein TE1 is substantially the same as the duration of the FID acquisition process.

A gradient update (block 310) corresponding to the next spoke in the sequence of spokes may be applied to obtain the next echo. The magnitude and the orientation of the sequence of gradient updates (block 310, when i_loop>1) may be substantially similar to the sequence of gradient updates (block 310, when i_loop=1) of the FID acquisition process. Moreover, the interval between gradient updates (block 310, when i_loop>1) may be substantially similar to the interval between gradient updates (block 310, when i_loop>1) of the FID acquisition process. As a result, the sequence of spokes sampled in the FID acquisition process may be substantially similar to the sequence of spokes sampled in the first gradient echo acquisition process, both in order as well as in dimensions. In this way, the set of gradient echo datasets obtained in the first gradient echo acquisition process (block 312) correspond to the FID datasets obtained in the FID acquisition process (block 306). The iterations of the gradient echo acquisition process continue until all k-space spokes corresponding to the segment are acquired, as represented by decision block 309.

In some implementations, multiple gradient echo acquisition processes substantially similar to the first gradient echo acquisition process may be used to obtain multiple gradient echo dataset corresponding to the same k-space segment. This may be represented by an instance of method 300 where the number of loops is greater than 2. As illustrated by decision block 322, if more gradient echo datasets within the segment is desired (i.e., number of loops>2), gradient echo acquisition process may be repeated. For example, a second gradient echo dataset (i_loop=3) may be acquired by performing a second gradient echo acquisition immediately following the first gradient echo acquisition process (i_loop=2). The resulting echo time for the second gradient echo dataset may be TE=2*TE1, wherein TE1 is substantially similar to the duration of the FID acquisition process. As another example, a self-refocusing pulse sequence may include a FID acquisition process (i_loop=1) to obtain a first FID dataset, a first gradient echo acquisition process (i_loop=2) to obtain a first gradient echo dataset, a second gradient echo acquisition process (i_loop=3) similar to the first gradient echo acquisition process to obtain a second gradient echo dataset and a third gradient echo acquisition process (i_loop=4) similar to the first gradient echo acquisition process to obtain a third gradient echo dataset. Since the RF excitation 304 takes place in the FID acquisition process, the second, the third and the fourth gradient echo dataset may be used with the FID dataset (without further RF excitation) to improve the measure of the relaxation times T1, T2 and/or T2*, depending on the desired image weighting. Moreover, quantification and production of T1, T2 or T2* maps and other images may use only gradient echo datasets, without using FID dataset.

Figure 4:
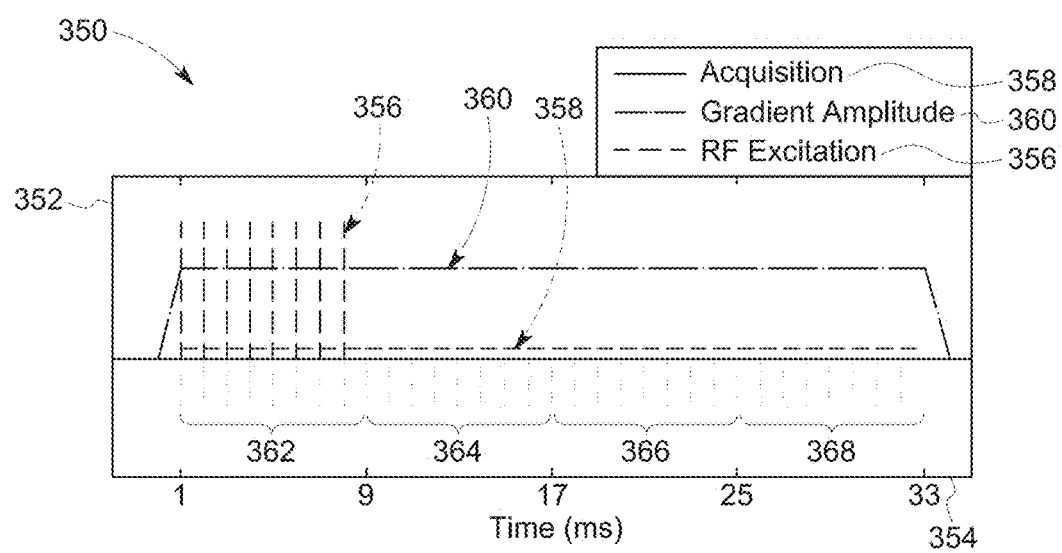
FIG. 4 illustrates a pulse sequence that may produce a silent, self-refocusing multi-gradient encoding sequence used in the technique of FIG. 3, in accordance with an embodiment.

FIG. 4 illustrates a plot 350 depicting an example of an implementation of a self-refocusing pulse sequence, according to method 300 of FIG. 3. The plot 350 schematically depicts coil activity 352 as a function of time 354 for the RF excitation coil (lines 356), the acquisition coil (lines 358) and the amplitude of the gradient encoding coils (curve 360). As illustrated by curve 360, the magnitude of the magnetic gradient field provided by the gradient coils is essentially constant through the entire pulse sequence. A FID acquisition process 362, which may correspond to the FID acquisition process (i_loop=1) of FIG. 3, illustrates a portion of the pulse sequence with 8 iterations corresponding to 8 spokes, as detailed below. For each iteration, an RF excitation pulse (lines 356) may be immediately followed by acquisition coil activity (lines 358). Before each subsequent RF excitation pulse, the gradient may be reoriented, while essentially preserving the gradient magnitude (curve 360). During the FID acquisition process 362, the acquisition coil obtains a portion of FID data, as described above.

A first gradient echo acquisition process 364 illustrates a portion of the pulse sequence with 8 iterations corresponding to 8 spokes (i.e., 8 spokes per loop), which in turn corresponding to the 8 spokes of the FID acquisition process 362. In other words, each spoke of the first gradient echo acquisition process 364 has a corresponding spoke in the FID acquisition process 362. In the first gradient echo acquisition process 364, the acquisition coil may become active between gradient reorientations, similarly to the FID acquisition process 362. However, the first gradient echo acquisition processes 364 involves the sampling of a first echo data and, therefore, does not include RF excitation pulses. In this example, a third iterative process 366 and a fourth iterative process 368 similar to the first gradient echo acquisition process 364 provide a second echo dataset and a third echo dataset, respectively.

Figure 5:
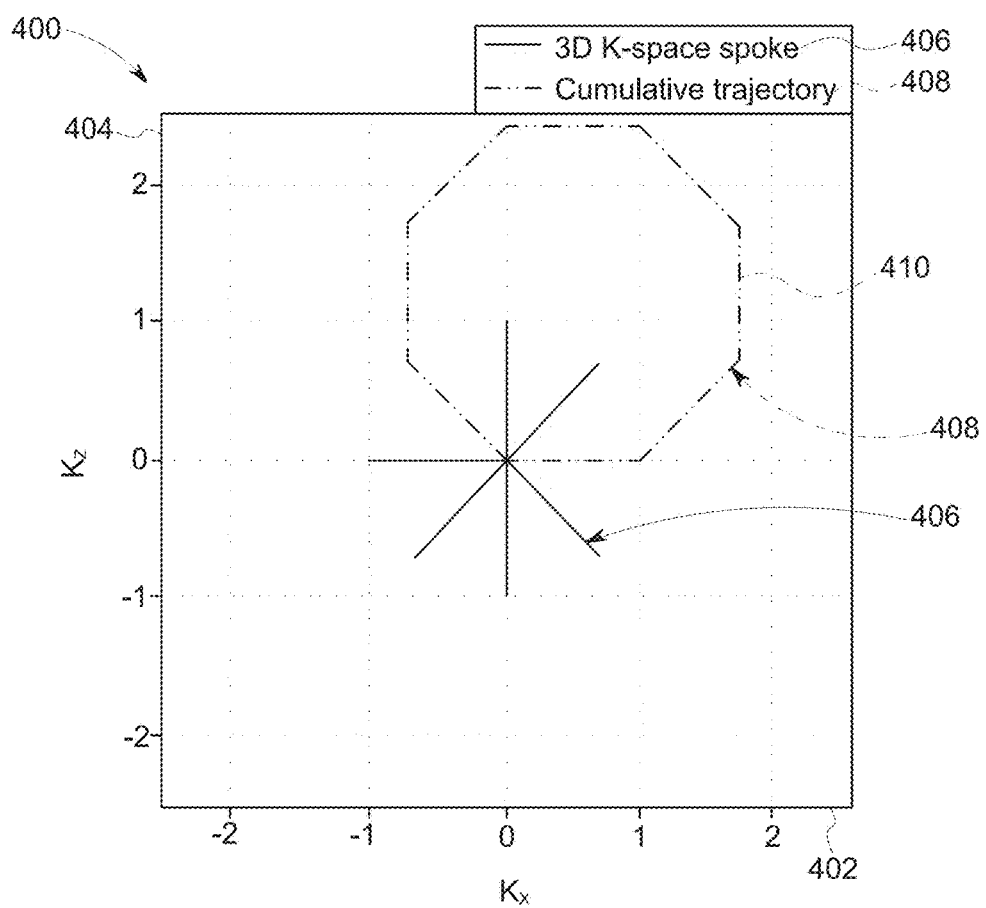
FIG. 5 illustrates a k-space diagram including an example of a segment having spokes related to the self-refocusing, multi-gradient encoding pulse sequence of FIG. 4, in accordance with an embodiment.

As discussed above, each self-refocusing pulse sequence obtains data corresponding to a region of the k-space covered by multiple spokes, which are illustrated in chart 400 of FIG. 5. Axis kx 402 and axis kz 404 are the frequency-space components corresponding to the spatial axes x and y of the image space. The chart 400 illustrates an example of a set of k-space spokes 406 that may be used in a single self-refocusing pulse sequence. The self-refocusing quality of the pulse sequence may be due to the looping geometry of the k-space spokes of the sequence. Looping geometry refers to the fact that a cumulative trajectory 408 of the set of k-space spokes 406 forms a closed trajectory. In other words, an interconnection (e.g., concatenation) of k-space spokes of a segment may end in the same point of k-space where it started. The example in chart 400 illustrates an 8-spoke trajectory forming a closed octagon.

In some implementations, a smaller or larger number of spokes (2, 3, 4, 32, 64, 128, 256, 1024 or any other number of spokes) may be used. Moreover, the length of the spokes may be substantially similar to each other. In some implementations, all the spokes of a segment may be in the plane produced by axis kx 402 and kz 404. In some embodiments, all the spokes of a segment may belong to a single plane embedded in the 3-dimension frequency space. In some embodiments, the N spokes of a segment may be in a plane and all the spokes may have substantially the same length, such as the 8-spoke set of k-space spokes 406 illustrated in chart 400. In these cases, the gradient updates that take place within each iterative process may be constant phase increments of $2\pi/N$. In other embodiments, the spokes may generate a closed 3-dimensional cumulative trajectory such that the trajectory is not confined to one plane. An example of such a trajectory may include a three-dimensional twisted loop geometry.

Figure 6:
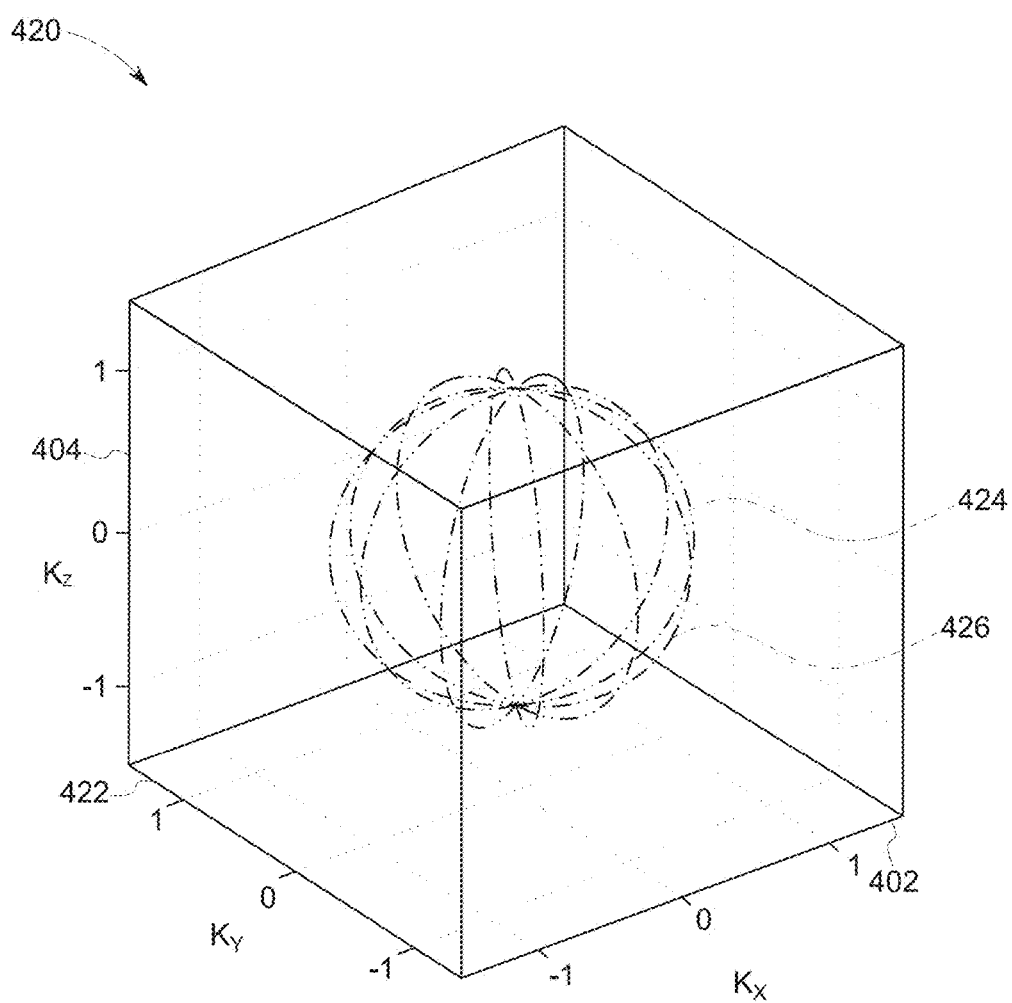
FIG. 6 illustrates a k-space diagram including a set of segments similar to the one of FIG. 5 that provide three-dimensional coverage of k-space, and that may be used in the technique of FIG. 2, in accordance with an embodiment.

FIG. 6 illustrates a three-dimensional chart 420 representing coverage that may be obtained by multiple self-refocusing segments. The chart 420 illustrates the cumulative trajectories of multiple segments embedded in the 3-dimensional frequency space with axis kx 402, kz 404 and ky 422 to form a sphere 424 including a plurality of rings 426. In some implementations, the multiple segments may form an ellipsoid. Each ring 426 corresponds to the cumulative trajectory of a single self-refocusing pulse sequence. The sphere 424 including the rings 426 provides sampling coverage of an entire 3-dimensional volume of the frequency-space, which may provide data sufficient to produce a true 3-dimensional image.

Acquired data may be sorted according to echo time into an FID data set and one or more gradient echo datasets. Gradient echo data obtained during a gradient echo acquisition process, originating from the refocusing of the earlier FID excitations, may include mixtures of echo-out signals (dephasing from the previous spoke) and echo-in signals (refocusing towards the next spoke). The echo-out and echo-in signals can be separated using source separation methods based on filtering or RF phase cycling. Separated echo-in and echo-out signals may be recombined in reconstruction by combining the echo-in signal obtained from a measurement of a spoke with the echo-out signal from the measurement of a subsequent spoke within the gradient echo acquisition process. In some implementations, the echo-out signal obtained from a measurement of a spoke may be combined with the echo-in signal of an antecedent spoke within the gradient echo acquisition process.

An example of filtering process for the signal separation described above, echo-in and echo-out contributions within each acquired correspondent to each spoke may be separated by applying a high-pass or a low-pass filter, such as fermi filter. In some applications, a low-pass filter may provide echo-out signal contributions and a high-pass filter may provide echo-in signal contributions.

As an example, data acquisition may be performed twice, without RF cycling in the first time and with alternating 0 deg/180 deg phase cycling in the second time. In this example, the echo-out and echo-in contributions can be separated via linear combination (i.e. addition or subtraction) of the single experiments. Moreover, phase cycling may be incorporated into a single data acquisition, by applying different RF phases for parallel but opposing k-space spokes.

Each dataset may be reconstructed using non-Cartesian image reconstruction algorithms such as gridding interpolation, parallel imaging, or low-rank/sparsity based reconstruction methods. Missing samples in the FID dataset, originating from finite transmit receive switching, may be filled via interpolation, or may be reacquired at lower imaging bandwidth. The reconstructed images corresponding to nominal echo times of TE=0, TE=n*ΔTE, with n being the iteration index, may be further processed to quantitative T2*, $\Delta B_0$, or magnetic susceptibility maps.

Figure 7:
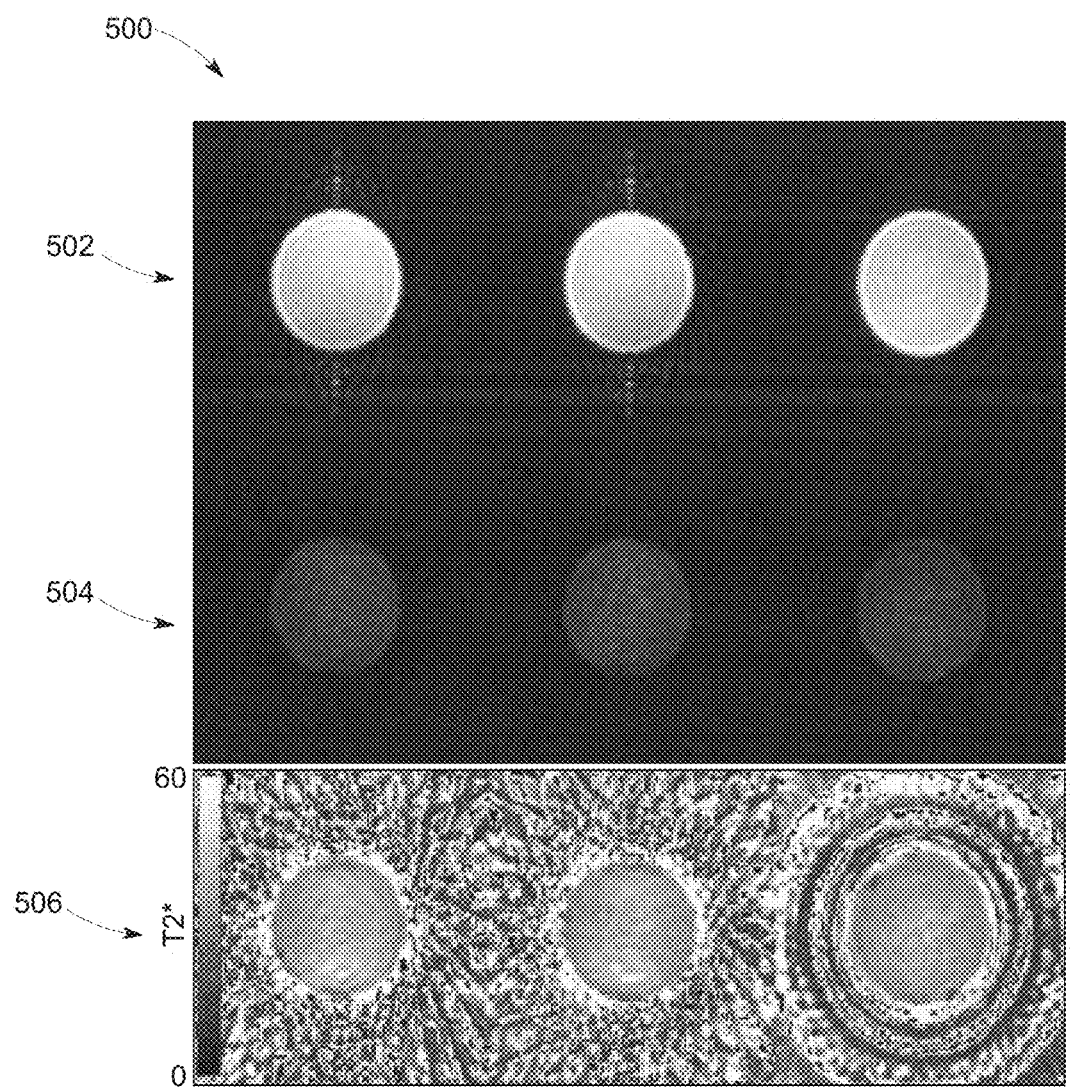
FIG. 7 illustrates imaging results of imaging a phantom produced employing a multi-gradient echo, MRI technique, in accordance with an embodiment.

Additionally or alternatively, the different datasets may be processed in a spectroscopic manner to resolve tissues of different chemical shift; similar to as done in Echo-Planar Chemical Shift Imaging (EPSI). The spectral bandwidth and spectral resolution are determined by the time it takes to perform each loop of the self-refocusing k-space trajectory, and the number of loops, respectively. In this way, the methods of the present disclosure also allow spectroscopic imaging providing spatially-resolved metabolite maps. The simplest application of this, would be Dixon, or IDEAL-type fat/water separation With the foregoing in mind, FIG. 7 illustrates a set of images 500 of a spherical phantom obtained employing an example of the methods and systems described above. For image set 500, the self-refocusing pulse sequence was implemented on a GE MR750w 3T scanner (GE Healthcare, Waukesha Wis.). To obtain data to produce the set of images 500, 4 iterative processes with 32 spokes each (totaling 128 spokes per segment) were performed, with the FID acquisition process providing a FID dataset and the subsequent 3 iterative processes providing gradient echo datasets. Resolution of the dataset is of 3×3×3 mm voxels and the field of view is 19.2 cm. The repetition time TR (interval between subsequent spokes) was ~1 ms and the resulting echo time TE (interval between iterative processes) was ~32 ms. Total scan time was 12 s. Row 502 illustrates an intensity image produced with the FID dataset corresponding to three different orthogonal planes of the image. Row 504 illustrates an intensity image produced with the first gradient echo dataset. Row 506 illustrates a T2* map produced using the multiple gradient echo datasets and the FID dataset. The obtained dataset provided a uniform spherical image that matches the expected value for T2* of 45 ms, which was obtained from a conventional 3D Cartesian spoiled gradient echo measurement.

Figure 8A:
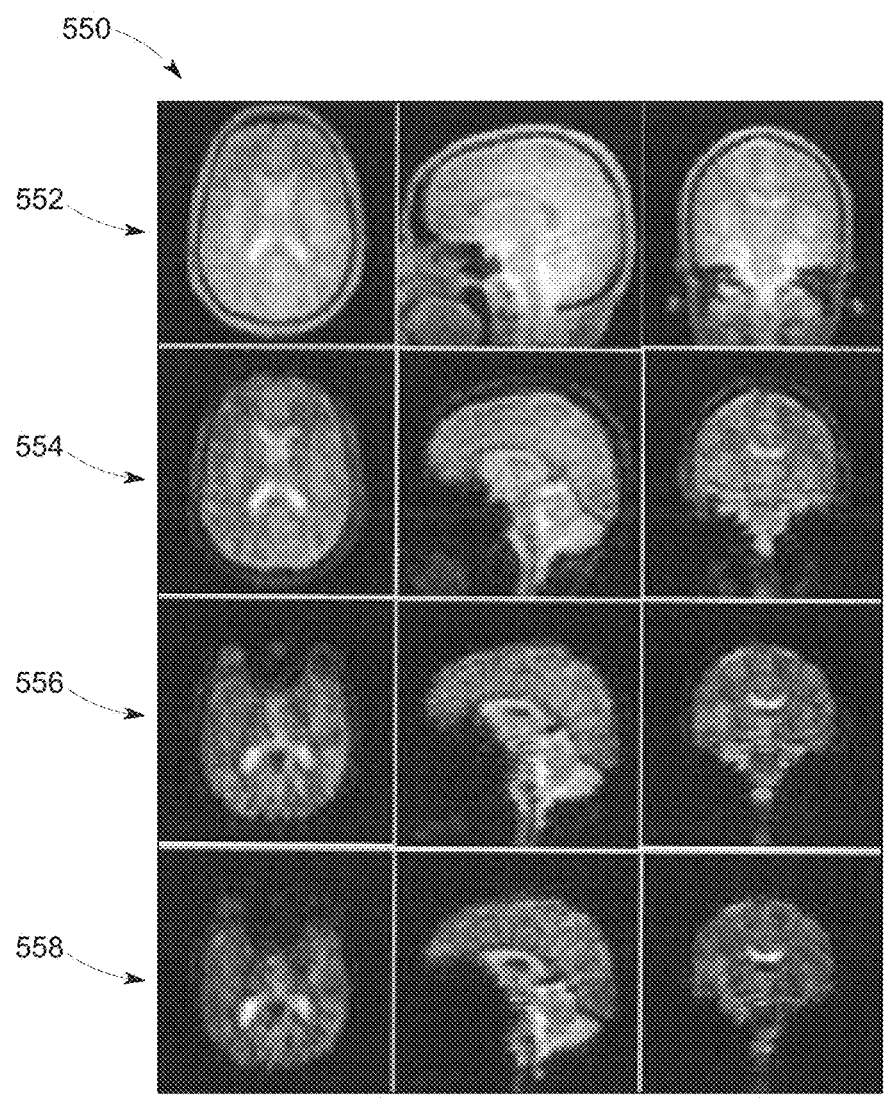
FIGS. 8A and 8B illustrate results of imaging a human head produced employing a silent, multi-gradient echo, MRI technique, in accordance with an embodiment.
Figure 8B:
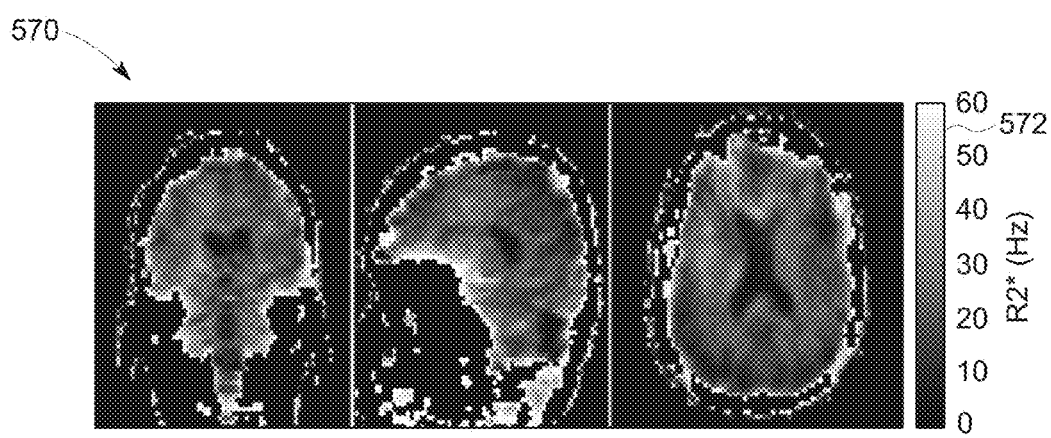

FIG. 8A illustrates a set of images 550 of a human head obtained employing an embodiment of the methods and systems described above. For this image set 550, the self-refocusing pulse sequence was implemented on a GE MR750w 3T scanner (GE Healthcare, Waukesha Wis.). Each segment was obtained using 4 iterative processes of 8 spokes, with the FID acquisition process providing a FID dataset and the subsequent 3 iterative processes providing gradient echo datasets. Resolution of the dataset is of 3×3×3 mm voxels and the field of view is 19.2 cm. The repetition time TR was 1.3 ms and the acquisition bandwidth was set to ±15.6 kHz. The acoustic noise measured within the bore during operation was equivalent to the background noise, at 72 dBA. Row 552 illustrates an intensity image obtained from the FID dataset. Rows 554, 556 and 558 illustrate intensity images obtained from the first, second and third gradient echo datasets, respectively. FIG. 8B illustrates a set of images 570 of a human head. Row 572 illustrates an R2* map obtained from the FID and the gradient echo datasets. The R2* may be calculated as 1/T2* at each voxel.

Technical effects of the invention include, but are not limited to, the capacity to obtain 3-dimensional T2*-weighted images using a MRI system in accordance with a ZTE acquisition sequence. These characteristics may be useful in fMRI measurements, susceptibility weighted imaging, quantitative T2* mapping, among other applications.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging method, comprising:
acquiring a free induction decay (FID) dataset from a subject using a magnetic resonance imaging system, wherein the FID dataset is obtained by performing a free induction decay (FID) acquisition process over iterations, each iteration corresponding to a k-space spoke of a sequence of k-space spokes, and wherein an iteration of the FID acquisition process comprises:
updating a magnetic field gradient based on a k-space spoke of the sequence of k-space spokes corresponding to the iteration of the FID acquisition process;
applying a radiofrequency excitation pulse while preserving the magnetic field gradient to encode the k-space spoke corresponding to the iteration of the FID acquisition process; and
acquiring a first dataset corresponding to the k-space spoke corresponding to the iteration of the FID acquisition process, wherein the first dataset is at least a portion of the FID dataset; and
wherein an interconnection of the k-space spokes of the sequence of k-space spokes forms a closed k-space trajectory that refocuses FID signals resulting from the application of the radiofrequency excitation pulse of an initial iteration of the FID acquisition process.

2. The method of claim 1, comprising acquiring at least a portion of a gradient echo dataset from the subject over the same sequence and the same order of k-space spokes as the FID acquisition process using the magnetic resonance imaging system, wherein the portion of the gradient echo dataset is obtained by performing a gradient echo acquisition process by repeating the iterations of the FID acquisition process but without applying radiofrequency excitation.

3. The method of claim 2, wherein the gradient echo acquisition process follows immediately the FID acquisition process, and wherein the gradient echo dataset obtained in the gradient echo acquisition process comprises a gradient echo data corresponding to a refocused portion of the FID dataset obtained during the corresponding iteration of the FID acquisition process.

4. The method of claim 2, wherein the magnetic field gradient is updated concurrently with the acquisition of data during the FID acquisition process and the gradient echo acquisition process such that at least one k-space spoke of the sequence of k-space spokes is curved.

5. The method of claim 2, wherein a magnitude of the magnetic field gradient is substantially constant at least throughout the multiple iterations of the FID acquisition process and the gradient echo acquisition process.

6. The method of claim 2, comprising reconstructing a complex image of the subject from at least the FID dataset or the gradient echo dataset.

7. The method of claim 2, comprising reconstructing a proton density map, a T2*map, an R2* map, a $\Delta B_0$ map, or a susceptibility map, or any combination thereof, of the subject from at least the FID dataset, the gradient echo dataset a subsequent gradient dataset, or any combination thereof.

8. The method of claim 2, comprising sorting acquired data according to echo time into at least the FID dataset and the gradient echo dataset.

9. The method of claim 2, comprising performing spectroscopic imaging by obtaining chemical shift maps via Fourier analysis of the obtained FID and gradient echo datasets.

10. The method of claim 2, wherein the gradient echo dataset obtained during the gradient echo acquisition process includes a mixture of echo-out signals and echo-in signals, and wherein the echo-out and echo-in signals are separated with low-pass filtering and high-pass filtering or phase cycling, and wherein the separated echo-out and echo-in signals are combined to produce a combined echo-in/echo-out dataset.

11. The method of claim 1, wherein the k-space spokes of the sequence of k-space spokes are in the same plane of a frequency space.

12. The method of claim 1, wherein the step of acquiring the first dataset begins immediately after the application of the non-selective radiofrequency excitation pulse such that the magnetic resonance imaging method is a zero-TE imaging method.

13. The method of claim 1, comprising applying a preparatory pulse sequence before the iteration of the FID acquisition process.

14. The method of claim 1, comprising acquiring two or more gradient echo datasets from the subject over the same sequence and the same order of k-space spokes as the FID acquisition process using the magnetic resonance imaging system, wherein the two or more gradient echo datasets are obtained by performing two or more respective gradient echo acquisition processes which each repeat the iterations of the FID acquisition process without applying radiofrequency excitation, and wherein the two or more respective gradient echo acquisition processes are performed sequentially.

15. A non-transitory computer-readable memory device comprising instructions for a magnetic resonance imaging system, the instructions comprising:
  causing gradient coils of the magnetic resonance imaging system to apply a sequence of magnetic field gradients over time to a subject, each magnetic field gradient of the sequence of magnetic field gradients corresponding to a k-space spoke of a sequence of k-space spokes;
  causing a radiofrequency excitation coil of the magnetic resonance imaging system to apply a radiofrequency excitation pulse to the subject while each magnetic field gradient of the sequence of magnetic field gradients is applied; and
  causing acquisition coils of the magnetic resonance imaging system to collect a free induction decay (FID) dataset corresponding to radiofrequency emissions from the subject immediately following each radiofrequency excitation pulse; and
  wherein an interconnection of the k-space spokes of the sequence of k-space spokes forms a closed k-space trajectory that refocuses FID signals resulting from the application of the radiofrequency excitation pulses corresponding to the sequence of magnetic field gradients.

16. The memory device of claim 15, wherein the instructions comprise:
  causing the gradient coils of the magnetic resonance imaging system to apply the sequence of magnetic field gradients over time to the subject; and
  causing the acquisition coils of the magnetic resonance imaging system to collect one or more gradient echo datasets corresponding to echoes of the radiofrequency emissions from the subject following the radiofrequency excitation.

17. The memory device of claim 16, wherein the instructions comprise generating a complex image from the FID dataset, at least one of the one or more gradient echo datasets, or any combination thereof.

18. The memory device of claim 17, wherein the instructions comprise generating a proton density map, a T2* map, an R2* map, a $\Delta B_0$ map, a susceptibility map, or any combination thereof, of the subject from the FID dataset, at least one of the one or more gradient echo datasets, or any combination thereof.

19. A magnetic resonance imaging system comprising:
  a scanner comprising gradient coils, a radiofrequency coil, and acquisition coils; and
  control circuitry configured to cause the scanner to:
  cause the gradient coils to apply a sequence of magnetic field gradients over time to a subject, each magnetic field gradient of the sequence of magnetic field gradients corresponding to a k-space spoke of a sequence of k-space spokes, wherein an interconnection of the k-space spokes of the sequence of k-space spokes forms a closed k-space trajectory;
  cause a radiofrequency excitation coil of the magnetic resonance imaging system to apply a radiofrequency excitation pulse to the subject while each magnetic field gradient of the sequence of magnetic field gradients is applied;
  cause acquisition coils of the magnetic resonance imaging system to collect a free induction decay (FID) dataset corresponding to radiofrequency emissions from the subject immediately following each radiofrequency excitation pulse, and wherein the closed k-space trajectory refocuses FID signals resulting from the application of the radiofrequency excitation pulses corresponding to the sequence of magnetic field gradients;
  cause the gradient coils to re-apply the sequence of magnetic field gradients to the subject and cause the acquisition coils to collect a gradient echo dataset corresponding to echoes of the radiofrequency emissions, wherein the re-application of the magnetic field gradients is performed such that the closed k-space trajectory is followed one or more times after acquisition of the FID dataset.

20. The system of claim 19, wherein the system comprises a bore for a patient, and wherein the control circuitry is configured to cause the gradient coils to apply the sequence of magnetic field gradients such that an acoustic noise level inside the bore is substantially the same as a background acoustic noise level of the system, and wherein the control circuitry is configured to produce a functional magnetic resonance image, a diagnostic medical image, or both, using the FID dataset.

21. A magnetic resonance imaging method performed using a magnetic resonance imaging system comprising gradient coils, acquisition coils, and a radiofrequency excitation coil, the magnetic resonance imaging method comprising:
- obtaining a free induction decay (FID) dataset and a gradient echo dataset corresponding to the FID dataset by:
- applying a sequence of magnetic field gradients over time to a subject using the gradient coils, each magnetic field gradient of the sequence of magnetic field gradients corresponding to a k-space spoke of a sequence of k-space spokes, wherein an interconnection of the k-space spokes of the sequence of k-space spokes forms a closed k-space trajectory;
- applying a radiofrequency excitation pulse to the subject using the radiofrequency excitation coil while each magnetic field gradient of the sequence of magnetic field gradients is applied;
- collecting the FID dataset corresponding to radiofrequency emissions from the subject immediately following each radiofrequency excitation pulse using the acquisition coils, and wherein the closed k-space trajectory refocuses FID signals resulting from the application of the radiofrequency excitation pulses corresponding to the sequence of magnetic field gradients; and
- re-applying the sequence of magnetic field gradients to the subject to re-trace the closed k-space trajectory while acquiring echoes of the radiofrequency emissions to obtain the gradient echo dataset.

\* \* \* \* \*